United States Patent
Kim et al.

(10) Patent No.: US 10,615,303 B2
(45) Date of Patent: *Apr. 7, 2020

(54) SOLAR CELL AND METHOD FOR MANUFACTURING THE SAME

(71) Applicant: LG ELECTRONICS INC., Seoul (KR)

(72) Inventors: Jinah Kim, Seoul (KR); Ilhyoung Jung, Seoul (KR); Seunghwan Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/364,875

(22) Filed: Mar. 26, 2019

(65) Prior Publication Data

US 2019/0229228 A1   Jul. 25, 2019

Related U.S. Application Data

(62) Division of application No. 15/224,015, filed on Jul. 29, 2016, now Pat. No. 10,290,765.

(30) Foreign Application Priority Data

Jul. 31, 2015   (KR) .................. 10-2015-0108565

(51) Int. Cl.
*H01L 31/18* (2006.01)
*H01L 31/0224* (2006.01)
(Continued)

(52) U.S. Cl.
CPC .. *H01L 31/1884* (2013.01); *H01L 31/022425* (2013.01); *H01L 31/022441* (2013.01);
(Continued)

(58) Field of Classification Search
CPC ......... H01L 31/1884; H01L 31/022425; H01L 31/022441; H01L 31/022466; H01L 31/0682; H01L 31/0747; H01L 31/18; H01L 31/1804; H01L 31/068; H01L 27/14636; H01L 21/00; H01L 31/02168; Y02E 10/50; Y02E 10/547
See application file for complete search history.

(56) References Cited

U.S. PATENT DOCUMENTS

2011/0192457 A1   8/2011   Nakayama et al.
2012/0142140 A1   6/2012   Li et al.
(Continued)

FOREIGN PATENT DOCUMENTS

EP   2077585 A1   7/2009
JP   2001-319887 A   11/2001
(Continued)

*Primary Examiner* — Timor Karimy
(74) *Attorney, Agent, or Firm* — Birch, Stewart, Kolasch & Birch, LLP

(57) ABSTRACT

A method for manufacturing a solar cell includes applying an electrode paste on a semiconductor substrate, the electrode paste including fine metal particles, a binder, and a solvent; and sintering the electrode paste using light to form an electrode, the sintering of the electrode paste to form the electrode including evaporating the solvent included in the electrode paste; and irradiating the light, after the evaporating of the solvent, to evaporate the binder included in the electrode paste and sinter the fine metal particles to form the electrode, the evaporating of the solvent and the irradiating of the light being performed at different temperatures, a temperature to evaporate the binder being higher than a temperature of the evaporating of the solvent, the solvent being evaporated at the temperature of about 80° C. to 150° C., and the binder being evaporated at the temperature of about 100° C. to 500° C.

12 Claims, 12 Drawing Sheets

(51) Int. Cl.
  *H01L 31/068* (2012.01)
  *H01L 31/0747* (2012.01)
  *H01L 31/0216* (2014.01)

(52) U.S. Cl.
  CPC .. *H01L 31/022466* (2013.01); *H01L 31/0682* (2013.01); *H01L 31/0747* (2013.01); *H01L 31/18* (2013.01); *H01L 31/02168* (2013.01); *Y02E 10/547* (2013.01)

(56) References Cited

U.S. PATENT DOCUMENTS

| | | |
|---|---|---|
| 2013/0341077 A1 | 12/2013 | Ouchi et al. |
| 2014/0037863 A1 | 2/2014 | Lim et al. |
| 2014/0170334 A1 | 6/2014 | Hui et al. |
| 2014/0287583 A1 | 9/2014 | Liu et al. |

FOREIGN PATENT DOCUMENTS

| | | |
|---|---|---|
| JP | 2002-252174 A | 9/2002 |
| JP | 2004-31867 A | 1/2004 |
| JP | 2006-41309 A | 2/2006 |
| JP | 2008-13466 A | 1/2008 |
| JP | 2008-522369 A | 6/2008 |
| JP | 2013-191742 A | 9/2013 |
| JP | 2014-11436 A | 1/2014 |
| JP | 2014-86243 A | 5/2014 |
| JP | 2014-515160 A | 6/2014 |
| JP | 2015-63590 A | 4/2015 |
| WO | WO 2015/012353 A1 | 1/2015 |

SOLAR CELL AND METHOD FOR MANUFACTURING THE SAME

CROSS-REFERENCE TO RELATED APPLICATION

This application is a Divisional application of U.S. patent application Ser. No. 15/224,015, filed on Jul. 29, 2016 (now U.S. Pat. No. 10,290,765 issued on May 14, 2019), which claims priority to and the benefit of Korean Patent Application No. 10-2015-0108565, filed in the Korean Intellectual Property Office on Jul. 31, 2015, where the entire contents of all of these applications are incorporated herein by reference into the present application.

BACKGROUND OF THE INVENTION

Field of the Invention

Embodiments of the invention relate to a solar cell and a method for manufacturing the same.

Description of the Related Art

In an industrial field including semiconductors, displays, solar cells, light emitting diodes (LEDs), etc., which are in the leading edge of modern technology industry, a very fine electronic pattern is formed on the surface of a glass substrate or a silicon substrate, and various functions of the industrial field are implemented using the electronic pattern.

However, a need to form the electronic pattern on a polymer or plastic substrate or paper, that are light and flexible, without forming the electronic pattern on the hard and heavy glass substrate has been recently on the rise strongly in the industrial field. Various attempts have been made to achieve the need.

As a method for forming the electronic pattern on the flexible substrate or the paper, a method has been proposed to form the electronic pattern on the substrate through a printing method and then to sinter the electronic pattern. It has been proposed to use white light in applying the method to a large-area substrate while sintering the electronic pattern at a low temperature.

It has been proposed to use a white light irradiation device in a technology for irradiating the white light onto an object and rapidly and accurately drying the object. Thus, the development of the white light irradiation device, that is usable in various fields, has been required.

SUMMARY OF THE INVENTION

In one aspect, there is provided a method for manufacturing a solar cell including applying an electrode paste on a semiconductor substrate and sintering the electrode paste using a light sintering device to form an electrode, wherein the sintering of the electrode paste includes a first evaporation operation for evaporating a solvent included in the electrode paste, a second evaporation operation for irradiating pulse type white light to evaporate a binder included in the electrode paste, and sintering fine metal particles to form the electrode.

It is preferable, but not required, that the pulse type white light is generated through a xenon flash lamp.

The electrode paste may include fine metal particles, a binder, and a solvent. An amount of the fine metal particles may be greater than a sum of an amount of the binder and an amount of the solvent, and the amount of the binder may be greater than the amount of the solvent. The fine metal particles may include at least one conductive material of silver (Ag), copper (Cu), Cu—Ni or Cu—Ag.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
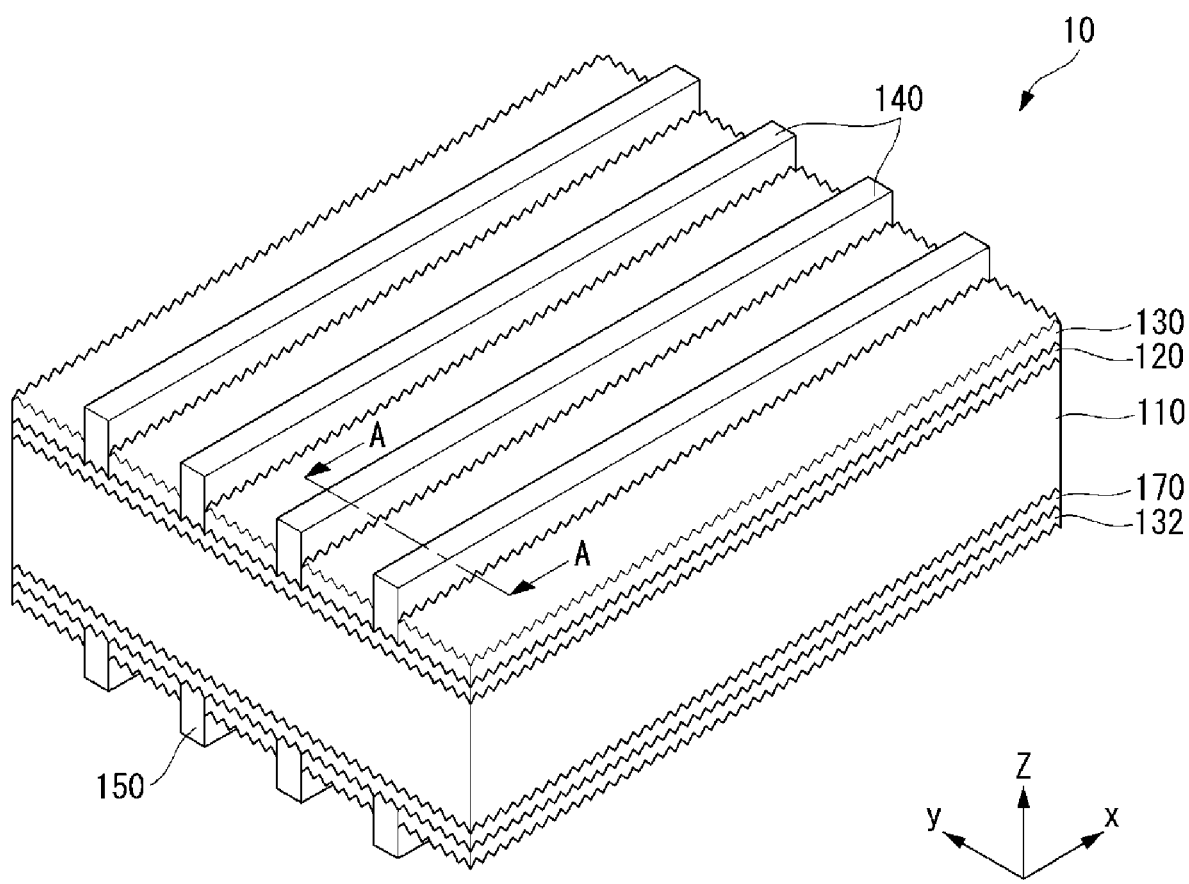
FIG. 1 illustrates an example of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

In the following description, the fact that any two values are substantially equal to each other means that the two values are equal to each other within a margin of error of 10% or less.

A solar cell according to an embodiment of the invention is described with reference to FIGS. 1 to 10.

Figure 2:
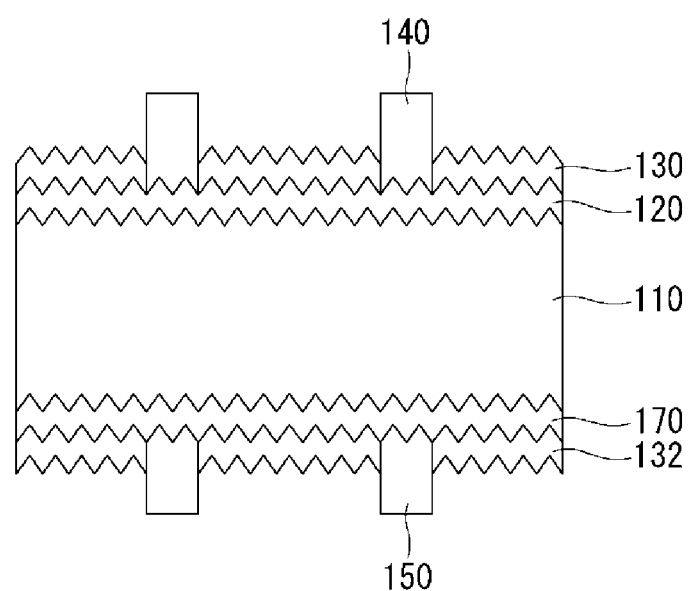
FIG. 2 is a cross-sectional view taken along line A-A of FIG. 1.

FIG. 1 illustrates an example of a solar cell according to an example embodiment of the invention. FIG. 2 is a cross-sectional view taken along line A-A of FIG. 1.

As shown in FIGS. 1 and 2, a solar cell 10 according to an example embodiment of the invention may include a semiconductor substrate 110, an emitter region 120, a first anti-reflection layer 130, a plurality of first electrodes 140, a back surface field (BSF) region 170, a second anti-reflection layer 132, and a plurality of second electrodes 150.

The solar cell 10 according to the embodiment of the invention is a bifacial solar cell that receives light from the outside through a first surface and a second surface of the semiconductor substrate 110, and can produce electric current using light incident on the first surface and the second surface of the semiconductor substrate 110.

The first and second anti-reflection layers 130 and 132 and the back surface field region 170 may be omitted, if necessary or desired. In the following description, the embodiment of the invention describes the solar cell including the first and second anti-reflection layers 130 and 132 and the back surface field region 170 as an example because the first and second anti-reflection layers 130 and 132 and the back surface field region 170 further improve efficiency of the solar cell.

The semiconductor substrate 110 includes the first surface (hereinafter, referred to as "front surface") and the second surface (hereinafter, referred to as "back surface"), and the front surface and the back surface are positioned opposite each other.

The semiconductor substrate 110 may be formed of silicon of a first conductive type, for example, an n-type, though not required. Silicon used in the semiconductor substrate 110 may be single crystal silicon, polycrystalline silicon, or amorphous silicon. For example, the semiconductor substrate 110 may be formed of a crystalline silicon wafer.

When the semiconductor substrate 110 is of the n-type, the semiconductor substrate 110 may be doped with impurities of a group V element, such as phosphorus (P), arsenic (As), and antimony (Sb). Alternatively, the semiconductor substrate 110 may be of a p-type. If the semiconductor substrate 110 is of the p-type, the semiconductor substrate 110 may be doped with impurities of a group III element, such as boron (B), gallium (Ga), and indium (In).

At least one of the front surface and the back surface of the semiconductor substrate 110 may have a plurality of uneven portions, so as to increase an absorptance of light by reducing a reflectance of light at the front surface and the back surface of the semiconductor substrate 110. FIGS. 1 and 2 show that only an edge of the semiconductor substrate 110 has the uneven portions for the sake of brevity and ease of reading. Thus, FIGS. 1 and 2 show that only an edge of the emitter region 120 positioned on the front surface of the semiconductor substrate 110 has the uneven portions. However, in fact, the entire front surface of the semiconductor substrate 110 has the uneven portions, and the entire surface of the emitter region 120 positioned on the front surface of the semiconductor substrate 110 has the uneven portions.

Light incident on the front surface of the semiconductor substrate 110 having the plurality of uneven portions is reflected several times by the uneven portions of the emitter region 120 and the uneven portions of the semiconductor substrate 110 and is incident inside the semiconductor substrate 110. Hence, an amount of light reflected from the front surface of the semiconductor substrate 110 decreases, and an amount of light incident inside the semiconductor substrate 110 increases. Further, surface areas of the semiconductor substrate 110 and the emitter region 120, on which light is incident, increase by the uneven portions, and an amount of light incident on the semiconductor substrate 110 increases.

As shown in FIGS. 1 and 2, the emitter region 120 is formed at the front surface of the semiconductor substrate 110 of the first conductive type and is a region formed by doping the semiconductor substrate 110 with impurities of a second conductive type (for example, p-type) opposite the first conductive type (for example, n-type). Namely, the emitter region 120 may be positioned inside the front surface of the semiconductor substrate 110. Thus, the emitter region 120 of the second conductive type forms a p-n junction along with a first conductive type region of the semiconductor substrate 110.

Carriers, i.e., electron-hole pairs produced by light incident on the semiconductor substrate 110 are separated into electrons and holes by the p-n junction between the semiconductor substrate 110 and the emitter region 120. Then, the separated electrons may move to the n-type semiconductor, and the separated holes may move to the p-type semiconductor. Thus, when the semiconductor substrate 110 is of the n-type and the emitter region 120 is of the p-type, the separated electrons may move to the semiconductor substrate 110, and the separated holes may move to the emitter region 120.

Because the emitter region 120 forms the p-n junction along with the semiconductor substrate 110, i.e., the first conductive type region of the semiconductor substrate 110, the emitter region 120 may be of the n-type when the semiconductor substrate 110 is of the p-type unlike the embodiment described above. In this instance, the separated holes may move to the back surface of the semiconductor substrate 110, and the separated electrons may move to the emitter region 120.

Returning to the embodiment of the invention, when the emitter region 120 is of the p-type, the emitter region 120 may be formed by doping the semiconductor substrate 110 with impurities of a group III element, such as B, Ga, and In. On the contrary, when the emitter region 120 is of the n-type, the emitter region 120 may be formed by doping the semiconductor substrate 110 with impurities of a group V element, such as P, As, and Sb.

As shown in FIGS. 1 and 2, the first anti-reflection layer 130 is positioned on the front surface of the semiconductor substrate 110. When the emitter region 120 is positioned on the front surface of the semiconductor substrate 110, the first anti-reflection layer 130 may be positioned on the emitter region 120.

The first anti-reflection layer 130 may be formed of at least one of aluminum oxide (AlOx), silicon nitride (SiNx), silicon oxide (SiOx), and silicon oxynitride (SiOxNy).

The first anti-reflection layer 130 reduces a reflectance of light incident on the solar cell 10 and increases selectivity of a predetermined wavelength band, thereby increasing the efficiency of the solar cell 10.

When the semiconductor substrate 110 has the uneven portions, the first anti-reflection layer 130 includes an uneven surface having a plurality of uneven portions similar to the semiconductor substrate 110.

In the embodiment of the invention, the first anti-reflection layer 130 has a single-layered structure. However, the first anti-reflection layer 130 may have a multi-layered structure, for example, a double-layered structure. In this instance, a passivation function of the first anti-reflection layer 130 may be further strengthened, and photoelectric efficiency of the solar cell 10 may be further improved. The first anti-reflection layer 130 may be omitted, if necessary or desired.

The first anti-reflection layer 130 may be formed on the front surface of the semiconductor substrate 110 using a chemical vapor deposition (CVD) method, such as a plasma enhanced chemical vapor deposition (PECVD) method.

As shown in FIGS. 1 and 2, the back surface field region 170 may be positioned at the back surface opposite the front surface of the semiconductor substrate 110. The back surface field region 170 is a region (for example, an $n^+$-type region) which is more heavily doped than the semiconductor substrate 110 with impurities of the same conductive type as the semiconductor substrate 110.

A potential barrier is formed by a difference between impurity concentrations of the first conductive type region of the semiconductor substrate 110 and the back surface field region 170. The potential barrier prevents or reduces holes from moving to the back surface field region 170 used as a moving path of electrons and makes it easier for electrons to move to the back surface field region 170. Thus, the back surface field region 170 reduces an amount of carriers lost by a recombination and/or a disappearance of electrons and holes at and around the back surface of the semiconductor substrate 110 and accelerates a movement of desired carriers (for example, electrons), thereby increasing the movement of carriers to the second electrodes 150.

As shown in FIGS. 1 and 2, the second anti-reflection layer 132 may be positioned on the back surface opposite the front surface of the semiconductor substrate 110. When the back surface field region 170 is positioned at the back surface of the semiconductor substrate 110, the second anti-reflection layer 132 may be positioned on the back surface field region 170. In this instance, the second anti-reflection layer 132 may minimize the reflection of light incident on the back surface of the semiconductor substrate 110.

The second anti-reflection layer 132 may be formed of at least one of aluminum oxide (AlOx), silicon nitride (SiNx), silicon oxide (SiOx), and silicon oxynitride (SiOxNy). The first anti-reflection layer 130 and the second anti-reflection layer 132 may be formed of the same material or different materials.

Further, the first anti-reflection layer 130 and the second anti-reflection layer 132 may be formed using the same method or different methods.

A passivation layer may be formed between the first anti-reflection layer 130 and the emitter region 120 and between the second anti-reflection layer 132 and the back surface field region 170. The passivation layer may be formed of non-crystalline semiconductor. For example, the passivation layer may be formed of intrinsic hydrogenated amorphous silicon (i-a-Si:H). The passivation layer may perform a passivation function, which converts a defect, for example, dangling bonds existing at and around the surface of the semiconductor substrate 110 into stable bonds using hydrogen (H) contained in the passivation layer and prevents or reduces a recombination and/or a disappearance of carriers moving to the surface of the semiconductor substrate 110. Thus, the passivation layer may reduce an amount of carriers lost by the defect at and around the surface of the semiconductor substrate 110. Hence, the passivation layer positioned on the front surface and the back surface of the semiconductor substrate 110 may reduce an amount of carriers lost by the defect at and around the surface of the semiconductor substrate 110, thereby improving the efficiency of the solar cell.

As shown in FIGS. 1 and 2, the plurality of first electrodes 140 are positioned on the front surface of the semiconductor substrate 110 and are separated from one another. Each first electrode 140 may extend in a first direction x. The electrodes, which are separated from one another on the front surface of the semiconductor substrate 110 and extend in the first direction x, may be referred to as front fingers.

The plurality of first electrodes 140 may pass through the first anti-reflection layer 130 and may be electrically and physically connected to the emitter region 120 positioned at the front surface of the semiconductor substrate 110. Namely, the first electrodes 140 may be positioned on the emitter region 120, on which the first anti-reflection layer 130 is not positioned.

The plurality of first electrodes 140 may be formed of at least one conductive material, for example, copper (Cu) and may collect carriers (for example, holes) moving to the emitter region 120.

As shown in FIGS. 1 and 2, the plurality of second electrodes 150 are positioned on the back surface of the semiconductor substrate 110 and are separated from one another. Each second electrode 150 may extend in the first direction x. The electrodes, which are separated from one another on the back surface of the semiconductor substrate 110 and extend in the first direction x, may be referred to as back fingers. The second electrodes 150 may be positioned opposite the first electrodes 140 at a location corresponding to the first electrodes 140 with the semiconductor substrate 110 interposed therebetween. Hence, the number of second electrodes 150 may be the same as the number of first electrodes 140. The embodiment of the invention is not limited thereto.

The plurality of second electrodes 150 may pass through the second anti-reflection layer 132 and may be electrically and physically connected to the back surface field region 170 positioned at the back surface of the semiconductor substrate 110. Namely, the second electrodes 150 may be positioned on the back surface field region 170, on which the second anti-reflection layer 132 is not positioned.

The plurality of second electrodes 150 may be formed of at least one conductive material, for example, cooper (Cu) and may collect carriers (for example, electrons) moving to the back surface field region 170.

In the bifacial solar cell, because an amount of light incident on the front surface of the semiconductor substrate 110 is more than an amount of light incident on the back surface of the semiconductor substrate 110, the number of second electrodes formed on the back surface of the semiconductor substrate 110 may be more than the number of first electrodes formed on the front surface of the semiconductor substrate 110. In this instance, a distance (i.e., a pitch) between the second electrodes 150 may be less than a distance between the first electrodes 140.

Figure 3A:
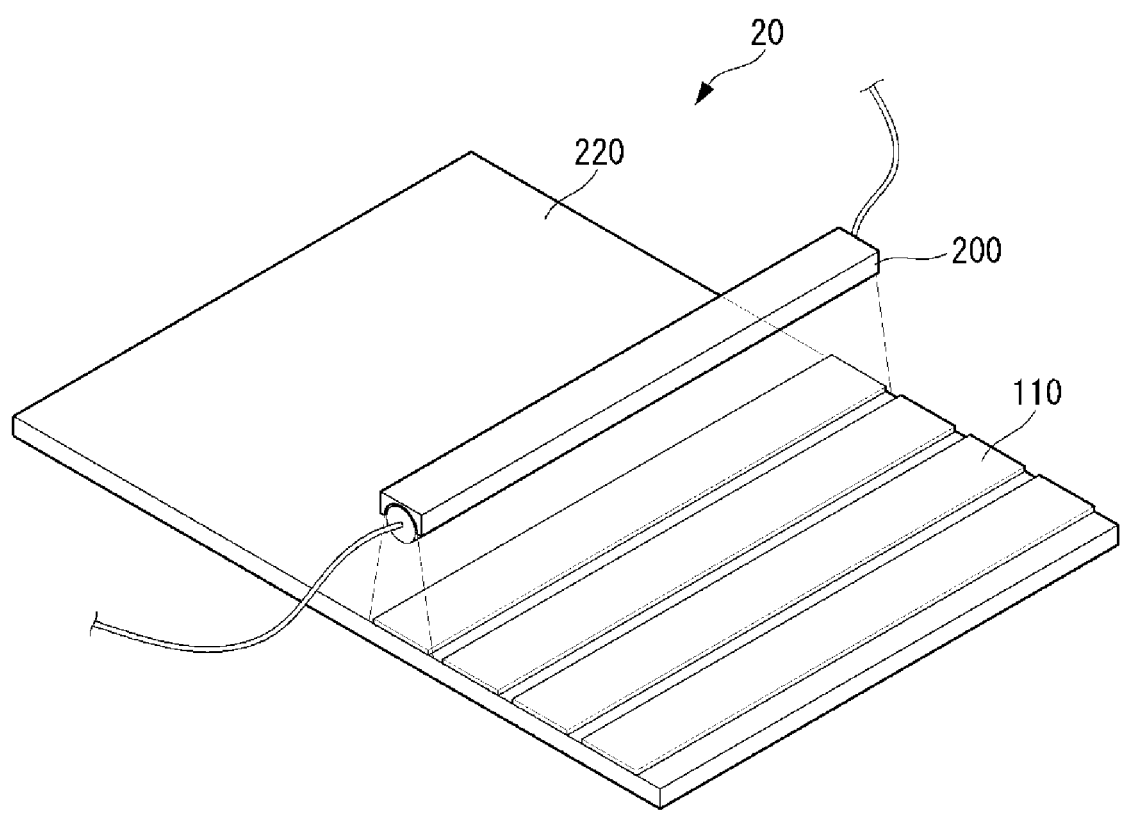
FIGS. 3A and 3B illustrate configuration of a light sintering device.
Figure 3B:
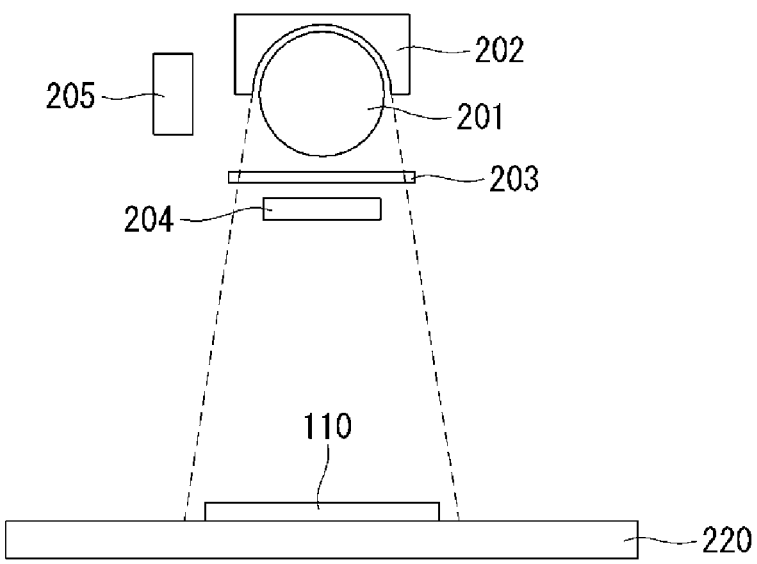
Figure 4:
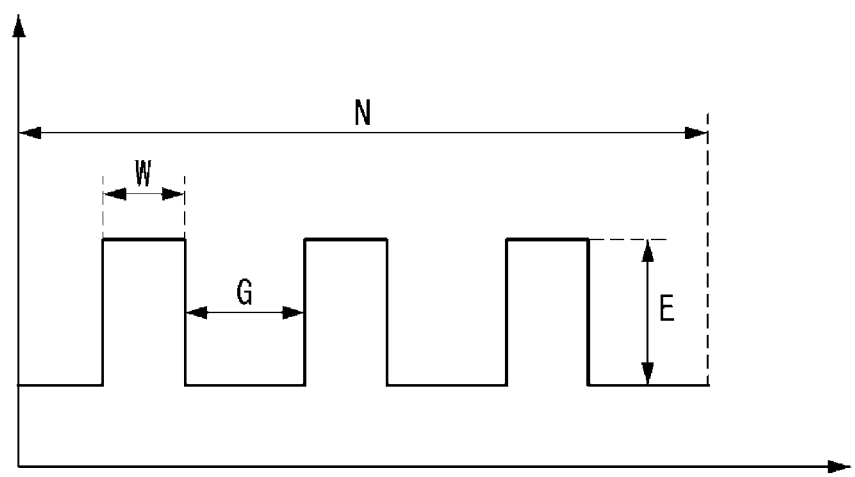
FIG. 4 is a graph illustrating parameters used in irradiation conditions of pulse type white light generated in a lamp.

FIGS. 3A and 3B illustrate configuration of a light sintering device. FIG. 4 is a graph illustrating parameters used in irradiation conditions of pulse type white light generated in a lamp.

The first electrodes 140 and the second electrodes 150 according to the embodiment of the invention may be formed using a light sintering device 20.

As shown in FIGS. 3A and 3B, the light sintering device 20 may include a light output unit 200, a power supply unit, a capacitor, and a transfer unit 220.

The light output unit 200 may include a lamp 201, a reflective plate 202, a light wavelength filter 203, a light induction unit 204, and a cooling unit 205.

The light output unit 200 may be positioned on the transfer unit 220. The light output unit 200 may receive a voltage and a current from the power supply unit and may receive carriers accumulated in the capacitor, thereby producing arc plasma. Hence, the light output unit 200 may output pulse type white light to the surface of the semiconductor substrate 110 and sinter an electrode paste through the irradiation of the pulse type white light, thereby forming an electrode.

As shown in FIG. 3B, the lamp 201 may use a xenon flash lamp. It is preferable, but not required, that white light is irradiated in a surface form.

The xenon flash lamp includes a xenon gas injected into a sealed quartz tube of a cylinder shape. The xenon gas outputs light energy from received electrical energy and has an energy conversion percentage exceeding 50%. Further, the xenon flash lamp includes a metal electrode, for example, a tungsten electrode in order to form an anode electrode and a cathode electrode on both sides of the xenon flash lamp. When the power supply unit applies high power and high current to the lamp 201, the xenon gas injected into the inside of the lamp 201 is ionized, and a spark is generated between the anode electrode and the cathode electrode. In this instance, when carriers accumulated in the capacitor are applied to the lamp 201, an arc plasma and light of a strong intensity are generated inside the lamp 201 while a current of about 1,000 A flows for 1 ms to 10 ms through the spark generated inside the lamp 201. The generated light has a light spectrum from ultraviolet light to infrared light, that are distributed in a wide wavelength of 160 nm to 2.5 mm, and thus is seen as white light.

The embodiment of the invention is described using the xenon flash lamp as an example of the lamp 201. Other lamps may be used as long as the above-described object can be achieved.

As shown in FIG. 4, the irradiation conditions using the lamp 201 may be controlled by parameters including an energy E, a pulse width W, a number N of pulses (hereinafter referred to as "pulse-number"), and a pulse gap G of the lamp 201 irradiating light, etc. It is preferable, but not required, that the lamp 201 uses the xenon flash lamp.

In the embodiment of the invention, the energy E of the lamp 201 may be about 1 J/cm$^2$ to 100 J/cm$^2$, more preferably, about 1 J/cm$^2$ to 50 J/cm$^2$.

When the energy E of the lamp 201 is less than about 1 J/cm$^2$, an electrode paste may not be smoothly sintered. When the energy E of the lamp 201 exceeds about 100 J/cm$^2$, the light sintering device 20 may be overloaded.

It is preferable, but not required, that the pulse width W of the lamp 201 is 0.1 ms to 50 ms in consideration of efficiency of a sintering process. More preferably, the pulse width W of the lamp 201 may be 0.1 ms to 20 ms.

It is preferable, but not required, that the number N of pulses of the lamp 201 is one to one hundred in consideration of the efficiency of the sintering process. More preferably, the number N of pulses may be one to fifty.

When the number N of pulses of the lamp 201 is equal to or greater than three, it is preferable, but not required, that a pulse gap of the xenon flash lamp is 1 ms to 100 ms in consideration of the efficiency of the sintering process and an influence on a lifespan of the light sintering device 20. More preferably, the pulse gap of the xenon flash lamp may be 5 ms to 50 ms.

As shown in FIG. 3B, the reflective plate 202 is positioned on an upper part of the lamp 201 and may change a light path so that pulse type white light output from the lamp 201 in the opposite direction of the semiconductor substrate 110 is output in a direction of the semiconductor substrate 110. Namely, the reflective plate 202 may cause light upwardly irradiated from the lamp 201 to be downwardly irradiated from the lamp 201.

As shown in FIG. 3B, the light wavelength filter 203 is positioned on a lower part of the lamp 201 and filters only intense pulsed white light having a predetermined wavelength band. In particular, because ultraviolet light irradiated from the lamp 201 using the xenon flash lamp may damage the semiconductor substrate 110 formed of a polymer material, light having an ultraviolet wavelength band has to be blocked. Further, a wavelength band of irradiated light may be selectively blocked depending on a kind of the semiconductor substrate 110.

As shown in FIG. 3B, the light induction unit 204 is positioned on a lower part of the light wavelength filter 203 and may adjust a position of the pulse type white light so that the pulse type white light may be irradiated onto the semiconductor substrate 110.

As shown in FIG. 3B, the cooling unit 205 may supply a coolant to the lamp 202 through a cooling path in order to reduce a surface temperature of the lamp 201. Because the surface temperature of the lamp 201 may rises to about 1200K to 1500K during a light output, an overheating phenomenon of the light output unit 200 can be prevented by cooling the lamp 201.

The power supply unit may generate a voltage and a current and may transfer the generated voltage and current to the light output unit 200.

The capacitor may accumulate and store carriers. When a spark is generated between both electrodes of the lamp 201 of the light output unit 200, the capacitor may transfer the stored carriers to the lamp 201.

As shown in FIG. 3B, the transfer unit 220 is positioned on a lower part of the light output unit 200. The transfer unit 220 may be a convey belt (or a conveyor belt) and may transfer the semiconductor substrate 110 in one direction. In this instance, the transfer unit 220 may include a heating plate for heating the semiconductor substrate 110 or a cooling plate for cooling the semiconductor substrate 110.

When the semiconductor substrate 110 is additionally heated through the heating plate, the sintering may be performed by a small energy of intense pulsed white light. Further, a lifespan of the lamp 201 may increase. When the semiconductor substrate 110 is additionally cooled through the cooling plate, damage of the semiconductor substrate 110 may be prevented.

In the bifacial solar cell having the above-described configuration, when light irradiated onto the solar cell 10 is incident on the semiconductor substrate 110 through the emitter region 120 and the back surface field region 170, a plurality of electron-hole pairs are generated in the semiconductor substrate 110 by light energy produced based on the incident light. In this instance, because the front surface and the back surface of the semiconductor substrate 110 are the textured surface, a light reflectance at the front surface and the back surface of the semiconductor substrate 110 is reduced. Further, because both incident and reflective operations are performed at the textured surfaces of the semiconductor substrate 110, the light is confined in the solar cell 10. As a result, an absorptance of light increase, and the efficiency of the bifacial solar cell, i.e., the solar cell 10, is improved.

In addition, because a reflection loss of light incident on the semiconductor substrate 110 is reduced by the first anti-reflection layer 130 and the second anti-reflection layer 132, an amount of light incident on the semiconductor substrate 110 further increases.

The electron-hole pairs are separated into electrons and holes due to the p-n junction between the semiconductor substrate 110 and the emitter region 120. Then, the separated electrons move to the back surface of the n-type semiconductor substrate 110, and the separated holes move to the p-type emitter region 120. In this instance, the semiconductor substrate 110 may be of the n-type and the emitter region 120 may be of the p-type.

The electrons moving to the semiconductor substrate 110 move to the second electrodes 150 through the back surface field region 170, and the holes moving to the emitter region 120 move to the first electrodes 140. When the first and second electrodes 140 and 150 are connected to each other using electric wires, current flows therein to thereby enable use of the current for electric power.

Figure 5A:
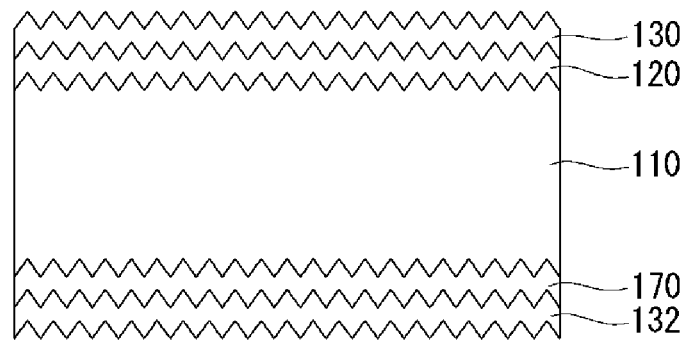
FIGS. 5A to 5C sequentially illustrate a method for manufacturing a solar cell shown in FIGS. 1 and 2.
Figure 5B:
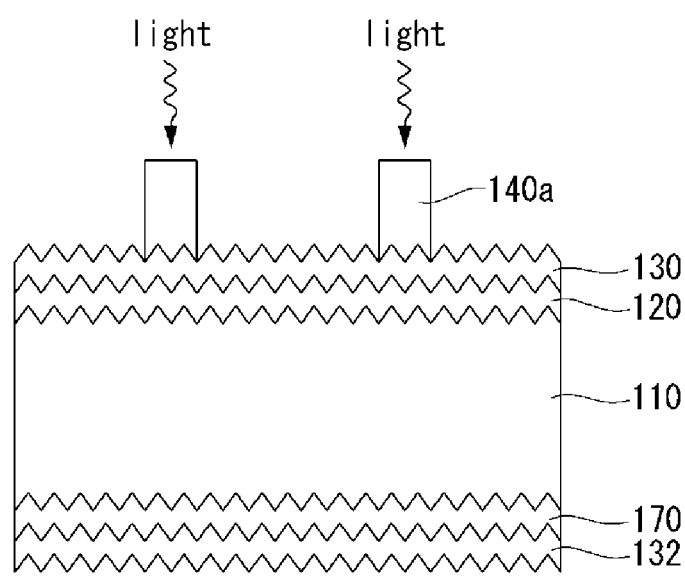
Figure 5C:
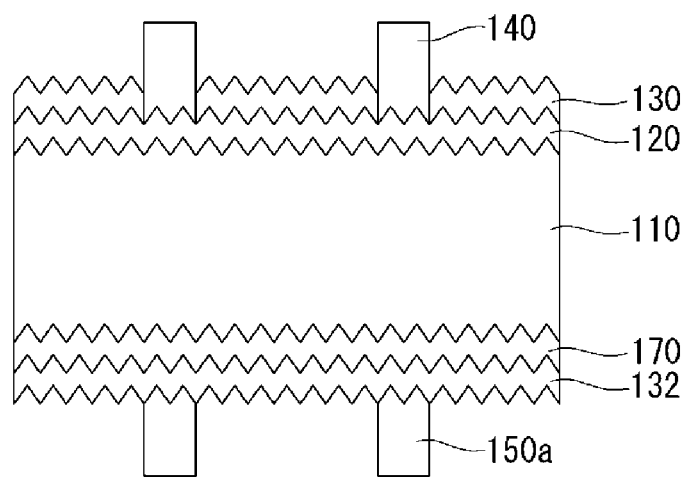

FIGS. 5A to 5C sequentially illustrate a method for manufacturing a solar cell shown in FIGS. 1 and 2. FIGS. 6A to 6D sequentially illustrate a light sintering method using a light sintering device shown in FIGS. 3A and 3B.

A method for manufacturing the solar cell according to the embodiment of the invention is described below with reference to FIGS. 5A to 5C and FIGS. 6A to 6D.

The front surface and the back surface of the semiconductor substrate 110 are formed as the textured surface. The emitter region 120 is formed at the front surface of the semiconductor substrate 110, and the back surface field region 170 is formed at the back surface of the semiconductor substrate 110.

More specifically, a high temperature thermal process of a material (for example, $B_2H_6$) containing impurities of a group III element, such as boron (B), gallium (Ga), and indium (In), is performed on the n-type semiconductor substrate 110 to diffuse the impurities of the group III element into the semiconductor substrate 110. Hence, the p-type emitter region 120 is formed at the entire surface of the semiconductor substrate 110.

If the semiconductor substrate 110 is of the p-type in another embodiment of the invention, a high temperature thermal process of a material (for example, $POCl_3$ or $H_3PO_4$) containing impurities of a group V element, such as phosphorus (P), arsenic (As), and antimony (Sb), may be performed on the semiconductor substrate 110 to diffuse the impurities of the group V element into the semiconductor substrate 110. Hence, the n-type emitter region 120 may be formed at the entire surface of the semiconductor substrate 110.

Subsequently, phosphorous silicate glass (PSG) containing phosphor (P) or boron silicate glass (BSG) containing boron (B) produced when n-type impurities or p-type impurities are diffused into the semiconductor substrate 110 is removed through an etching process.

In this instance, each of the front surface and the back surface of the semiconductor substrate 110 are formed as the textured surface using a wet etching process or a dry etching process using plasma. Hence, the emitter region 120 has the uneven surface due to the shape of the textured surface of the semiconductor substrate 110.

Next, the back surface field region 170 is formed at the back surface of the semiconductor substrate 110 using a thermal diffusion method.

More specifically, the thermal diffusion method may pre-deposit a material (for example, $BBr_3$) containing impurities of a group III element, such as boron (B), gallium (Ga), and indium (In), on the semiconductor substrate 110 and may drive-in the pre-deposited impurities of the group III element into the semiconductor substrate 110 to form the back surface field region 170.

The back surface field region 170 may be formed at the entire back surface of the semiconductor substrate 110 as shown in FIGS. 1 and 2. Alternatively, the back surface field region 170 may be locally formed at a location corresponding to the second electrodes 150 at the back surface of the semiconductor substrate 110.

Figure 7:
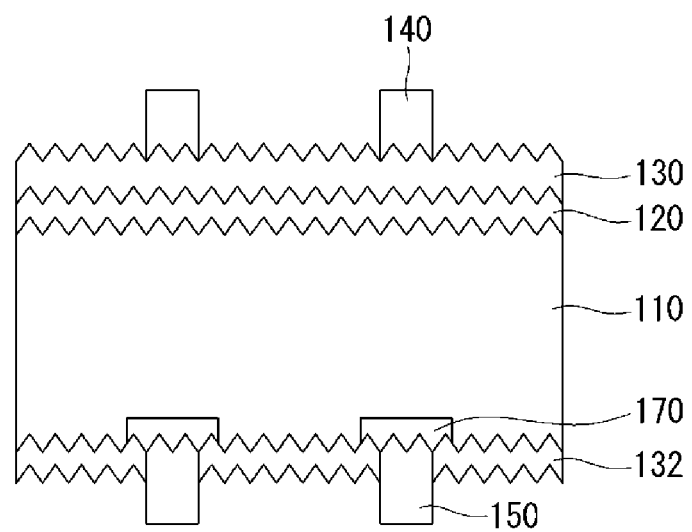
FIG. 7 illustrates another example of a back surface field region shown in FIGS. 1 and 2.

For example, as shown in FIG. 7, the back surface field region 170 may be locally formed at a location corresponding to the second electrodes 150 at the back surface of the semiconductor substrate 110 by depositing and diffusing impurities of a group III element.

The emitter region 120 and the back surface field region 170 may be formed through a process using laser doping, a process using laser patterning and laser doping, a process using an anti-diffusion layer, and the like.

Next, the first anti-reflection layer 130 and the second anti-reflection layer 132 are respectively formed on the front surface and the back surface of the semiconductor substrate 110 using various layer formation methods, for example, the PECVD method. The first anti-reflection layer 130 and the second anti-reflection layer 132 may be formed of the same material or different materials. The first anti-reflection layer 130 and the second anti-reflection layer 132 may have a single-layered structure or a multi-layered structure and may be formed using the same method or different methods.

A passivation layer may be formed between the first anti-reflection layer 130 and the emitter region 120 and between the second anti-reflection layer 132 and the back surface field region 170.

Next, the solar cell 10 including the first and second anti-reflection layers 130 and 132 on the front surface and the back surface of the semiconductor substrate 110 is positioned on the transfer unit 220 of the light sintering device 20.

Next, as shown in FIG. 5A, a first electrode paste 140a is applied to the front surface of the semiconductor substrate 110 in the first direction x. In this instance, various application methods including an inkjet printing method, a screen printing method, a spin coating method, etc. may be used to apply the first electrode paste 140a to the front surface of the semiconductor substrate 110.

Figure 6A:
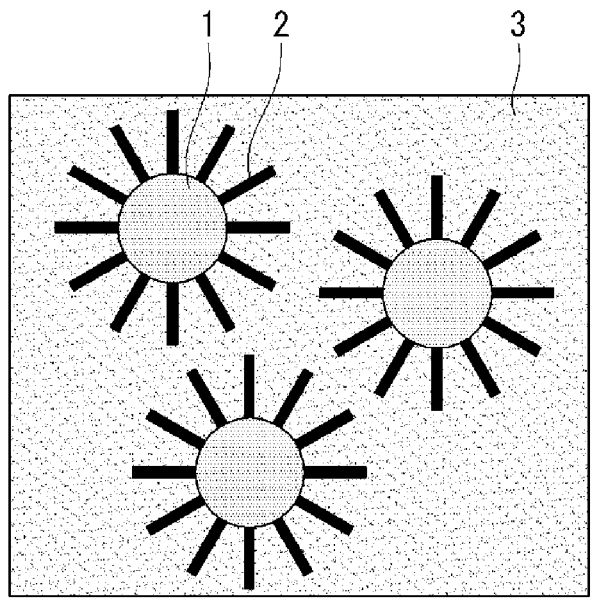
FIGS. 6A to 6D sequentially illustrate a light sintering method using a light sintering device shown in FIGS. 3A and 3B.

More specifically, as shown in FIG. 6A, the first electrode paste 140a may include fine metal particles 1, a binder 2, and a solvent 3. In this instance, the first electrode paste 140a is in a non-sintered state.

The fine metal particles 1 may be formed of at least one conductive material of silver (Ag), copper (Cu), Cu—Ni or Cu—Ag and may be a micro-sized powder or a nano-sized powder.

The first electrode paste 140a may include the fine metal particles 1 of about 50 to 80 wt %, the binder 2 of about 15 to 40 wt %, and the solvent 3 of about 5 to 40 wt %.

It is preferable, but not required, that an amount of the fine metal particles 1 is greater than a sum of an amount of the binder 2 and an amount of the solvent 3, and the amount of the binder 2 is greater than the amount of the solvent 3.

Next, as shown in FIG. 5B, pulse type white light is irradiated onto the front surface of the semiconductor substrate 110 to sinter the first electrode paste 140a. Hence, the first electrode 140 is formed. In this instance, an evaporation of the solvent 3 and an evaporation of the binder 2 of the first electrode paste 140a are performed at a low temperature (for example, equal to or lower than 500° C.).

Figure 6B:
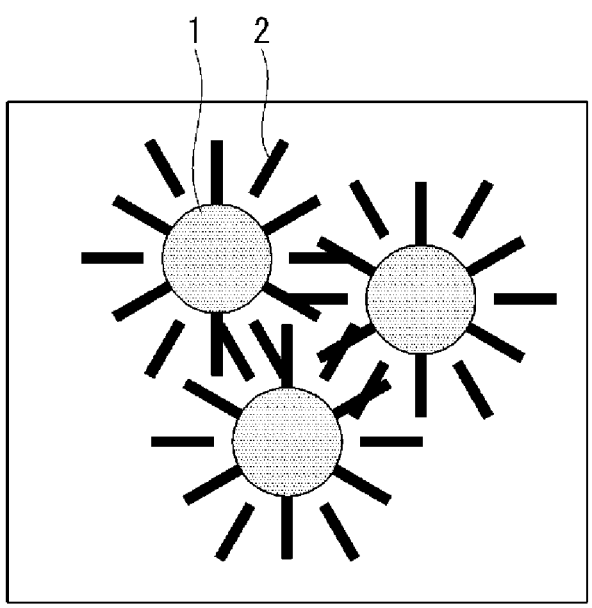

More specifically, as shown in FIG. 6B, the solvent 3 included in the first electrode paste 140a is evaporated. In this instance, the solvent 3 may be evaporated at a minimum temperature of about 80° C. For example, the solvent 3 may be evaporated at a temperature of about 80° C. to 150° C.

Figure 6C:
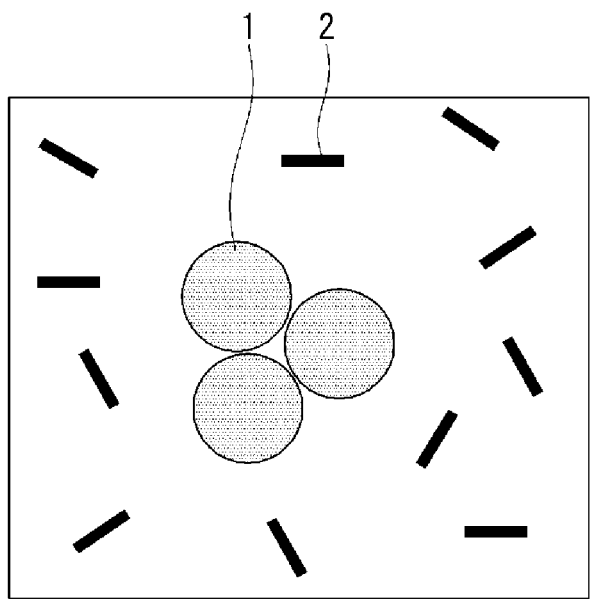

Next, as shown in FIG. 6C, pulse type white light is irradiated onto the first electrode paste 140a, in which the solvent 3 is evaporated, to evaporate the binder 2. The temperature of the evaporation of the binder 2 may be different from the temperature of the evaporation of the solvent 3. For example, since the pulse type white light is irradiated in the evaporation of the binder 2, the temperature of the evaporation of the binder 2 may be higher than the temperature of the evaporation of the solvent 3. In this instance, the binder 2 may be evaporated at a temperature equal to or higher than about 100° C. For example, the binder 2 may be evaporated at a temperature of about 100° C. to 500° C.

However, the embodiment of the invention is not limited thereto. The binder 2 may be evaporated at the same temperature as the solvent 3.

An irradiation time of the pulse type white light (more specifically, irradiation time it takes to irradiate the pulse type white light once) may be about 0.1 ms to 10 ms and may be adjusted depending on the amounts of the fine metal particles 1, the binder 2, and the solvent 3 included in the first electrode paste 140a. For example, the irradiation time of the pulse type white light (more specifically, the irradiation time it takes to irradiate the pulse type white light once) may be about 0.1 ms to 2 ms, and the irradiation time it takes to irradiate the pulse type white light 10 to 30 times may be about 1 ms to 40 ms. The sintering of the fine metal particles 1 may be efficiently performed within the above range.

Figure 6D:
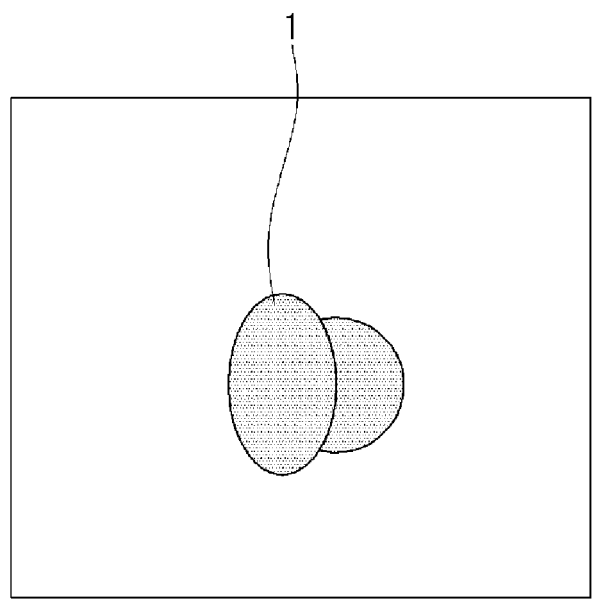

Next, as shown in FIG. 6D, the first electrode 140 is formed by sintering the fine metal particles 1. In the embodiment of the invention, the first electrode 140 may be formed of copper (Cu).

As described above, the light sintering device 20 may irradiate the pulse type white light generated from the xenon flash lamp onto the first electrode paste 140a including the fine metal particles 1 and thus may sinter the fine metal particles 1 without damage.

Further, the light sintering device 20 may irradiate the pulse type white light onto the first electrode paste 140a for about 0.1 ms to 10 ms, thereby reducing time required in the sintering process.

The fine metal particles 1 formed of a material, for example, copper (Cu), that is easily oxidized, may be sintered for a short period of time through a reduction in time required in the sintering process. Thus, the oxidization of the fine metal particles 1 can be prevented.

It is generally known that it is very difficult to sinter copper because an oxide layer is formed on the surface of copper due to thermal chemical equilibrium, resulting in a reduction in conductivity of copper after the sintering. Further, because a laser sintering method may be used to sinter a very small area, the laser sintering method lacks practicality.

However, because the embodiment of the invention irradiates the pulse type white light onto the fine metal particles 1 for a short period of time using the xenon flash lamp to sinter the fine metal particles 1, the oxidization of the fine metal particles 1 can be prevented.

Moreover, because the first electrode 140 is formed of copper, the material cost can be further reduced. Thus, the embodiment of the invention can simplify the sintering process and reduce the material cost without a reduction in an adhesive strength between the semiconductor substrate 110 and the first electrode 140, thereby further improving the efficiency of the solar cell.

Next, as shown in FIG. 5C, a second electrode paste 150a is applied to the back surface of the semiconductor substrate 110 at a location corresponding to the first electrode paste 140a in the first direction x. The second electrode paste 150a may be formed on the back surface of the semiconductor substrate 110 through the same method as the first electrode paste 140a.

More specifically, as shown in FIG. 6A, the second electrode paste 150a may include fine metal particles 1, a binder 2, and a solvent 3. In this instance, the second electrode paste 150a is in a non-sintered state.

The fine metal particles 1 may be formed of at least one conductive material of silver (Ag), copper (Cu), Cu—Ni or Cu—Ag and may be a micro-sized powder or a nano-sized powder.

The second electrode paste 150a may include the fine metal particles 1 of about 50 to 80 wt %, the binder 2 of about 15 to 40 wt %, and the solvent 3 of about 5 to 40 wt %.

It is preferable, but not required, that an amount of the fine metal particles 1 is greater than a sum of an amount of the binder 2 and an amount of the solvent 3, and the amount of the binder 2 is greater than the amount of the solvent 3.

The second electrode paste 150a may be formed using the same material as the first electrode paste 140a. Other materials may be used.

Next, as shown in FIG. 5C, pulse type white light is irradiated onto the back surface of the semiconductor substrate 110 to sinter the second electrode paste 150a. Hence, the second electrode 150 is formed. In this instance, an evaporation of the solvent 3 and an evaporation of the binder 2 of the second electrode paste 150a are performed at a low temperature (for example, equal to or lower than 500° C.).

More specifically, as shown in FIG. 6B, the solvent 3 included in the second electrode paste 150a is evaporated. In this instance, the solvent 3 may be evaporated at a minimum temperature of about 80° C. For example, the solvent 3 may be evaporated at a temperature of about 80° C. to 150° C.

Next, as shown in FIG. 6C, pulse type white light is irradiated onto the second electrode paste 150a, in which the solvent 3 is evaporated, to evaporate the binder 2. The temperature of the evaporation of the binder 2 may be different from the temperature of the evaporation of the solvent 3. For example, since the pulse type white light is irradiated in the evaporation of the binder 2, the temperature of the evaporation of the binder 2 may be higher than the temperature of the evaporation of the solvent 3. In this instance, the binder 2 may be evaporated at a temperature equal to or higher than about 100° C. For example, the binder 2 may be evaporated at a temperature of about 100° C. to 500° C.

However, the embodiment of the invention is not limited thereto. The binder 2 may be evaporated at the same temperature as the solvent 3.

An irradiation time of the pulse type white light may be about 0.1 ms to 10 ms and may be adjusted depending on the amounts of the fine metal particles 1, the binder 2, and the solvent 3 included in the second electrode paste 150a.

Next, as shown in FIG. 6D, the second electrode 150 is formed by sintering the fine metal particles 1. In the embodiment of the invention, the second electrode 150 may be formed of copper (Cu).

As described above, the light sintering device 20 may irradiate the pulse type white light generated from the xenon flash lamp onto the second electrode paste 150*a* including the fine metal particles 1 and thus may sinter the fine metal particles 1 without damage.

Further, the light sintering device 20 may irradiate the pulse type white light onto the second electrode paste 150*a* for about 0.1 ms to 10 ms, thereby reducing time required in the sintering process.

The fine metal particles 1 formed of a material, for example, copper (Cu), that is easily oxidized, may be sintered for a short period of time through a reduction in time required in the sintering process. Thus, the oxidization of the fine metal particles 1 can be prevented.

It is generally known that it is very difficult to sinter copper because an oxide layer is formed on the surface of copper due to thermal chemical equilibrium, resulting in a reduction in conductivity of copper after the sintering. Further, because a laser sintering method may be used to sinter a very small area, the laser sintering method lacks practicality.

However, because the embodiment of the invention irradiates the pulse type white light onto the fine metal particles 1 for a short period of time using the xenon flash lamp to sinter the fine metal particles 1, the oxidization of the fine metal particles 1 can be prevented.

Moreover, because the second electrode 150 is formed of copper, the material cost can be further reduced. Thus, the embodiment of the invention can simplify the sintering process and reduce the material cost without a reduction in an adhesive strength between the semiconductor substrate 110 and the second electrode 150, thereby further improving the efficiency of the solar cell.

The embodiment of the invention described that the second electrode is formed after the first electrode is formed, but is not limited thereto. For example, the second electrode may be formed, and then the first electrode may be formed.

Figure 8:
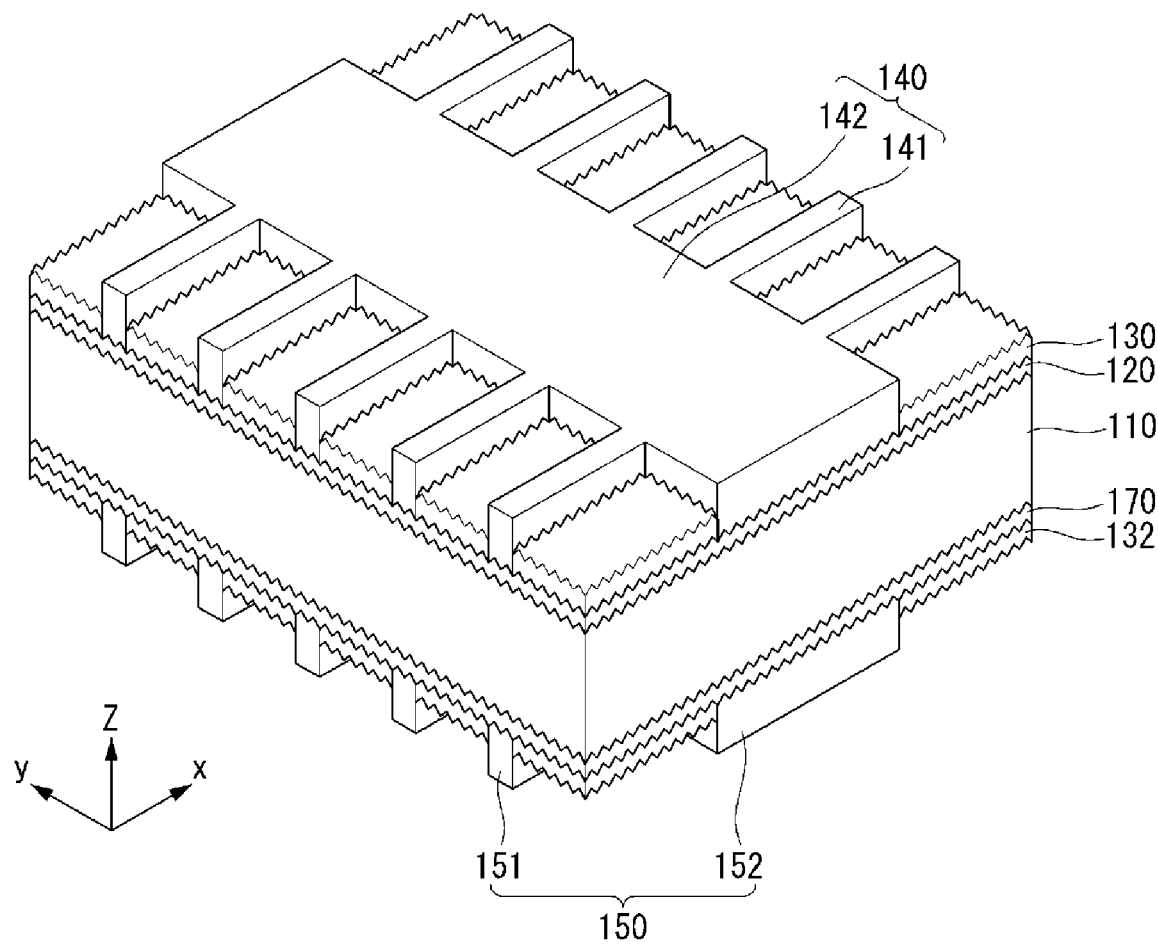
FIGS. 8 to 10 illustrate other examples of a solar cell according to an example embodiment of the invention.
Figure 9:
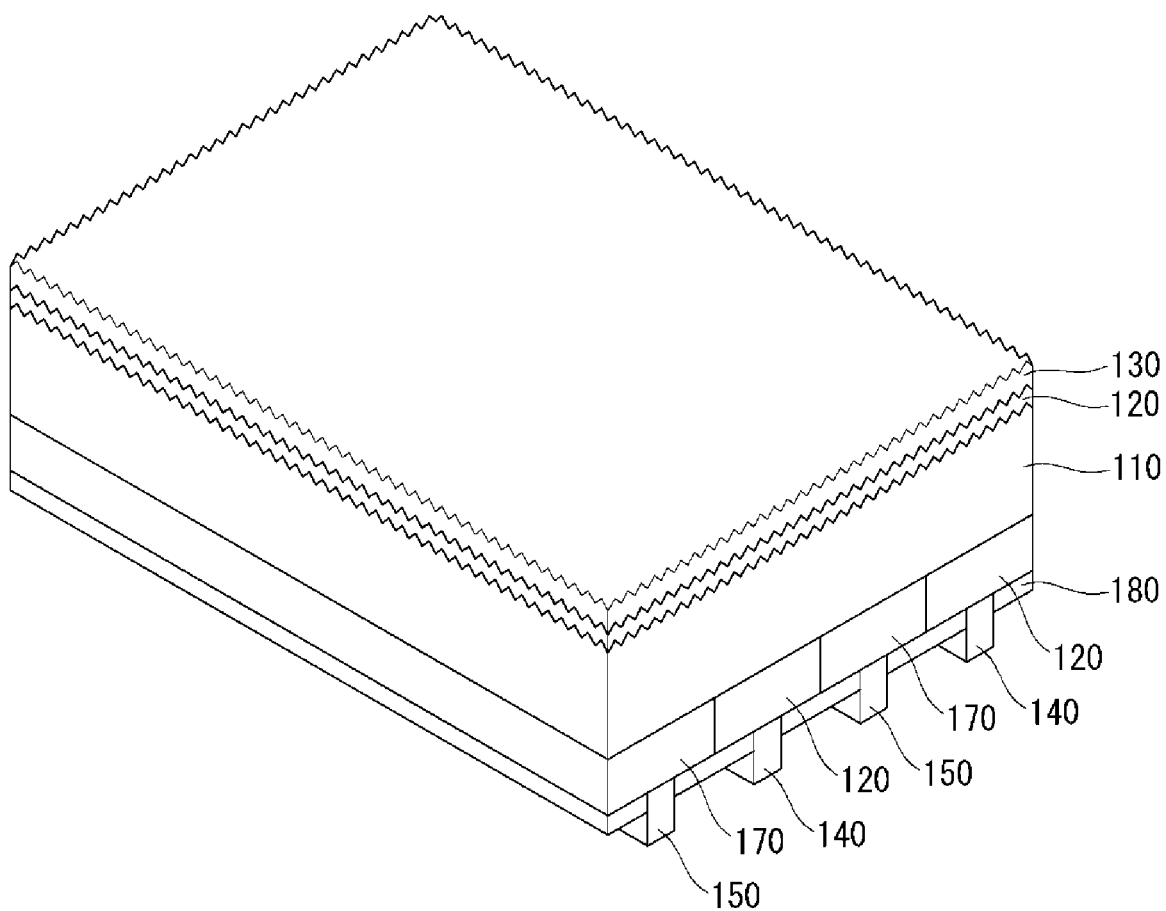
Figure 10:
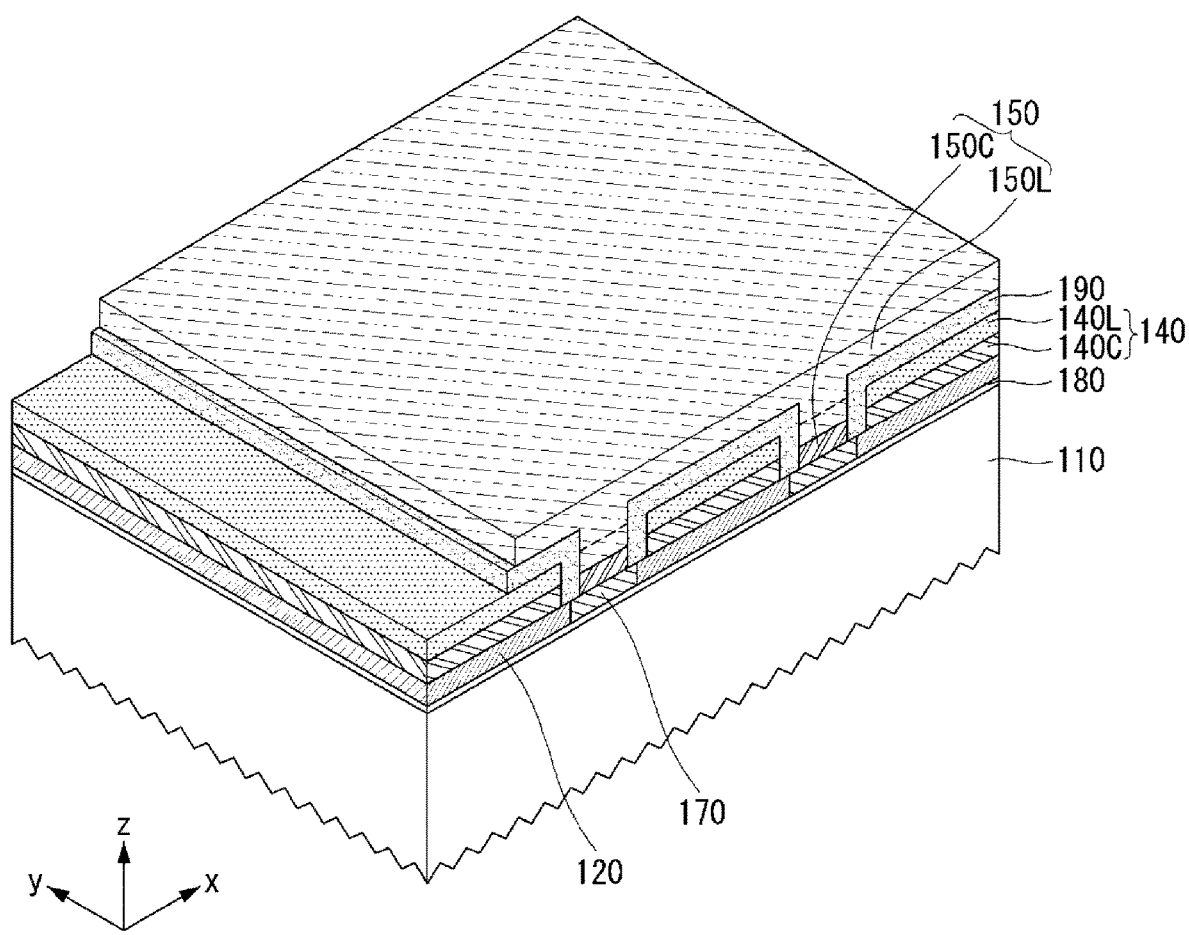

FIGS. 8 to 10 illustrate other examples of a solar cell according to an example embodiment of the invention.

As shown in FIG. 8, another example of a solar cell according to the embodiment of the invention, to which the electrode forming method according to the embodiment of the invention is applicable, may include front fingers 141 extending in the first direction x and a front bus bar 142 extending in a direction (i.e., a second direction y) crossing a longitudinal direction of the front fingers 141 as a first electrode 140, unlike FIGS. 1 and 2.

A second electrode 150 may include back fingers 151, that are positioned on a back surface of a semiconductor substrate 110 to be separated from one another and extend in the first direction x, and a back bus bar 152 extending in a direction (i.e., the second direction y) crossing a longitudinal direction of the back fingers 151.

For example, the back fingers 151 may be formed at a location corresponding to the front fingers 141 of the first electrode 140, and the back bus bar 152 may be formed at a location corresponding to the front bus bar 142 of the first electrode 140.

Furthermore, as shown in FIG. 9, the electrode forming method according to the embodiment of the invention may be applied to a solar cell, in which first and second electrodes 140 and 150 are positioned on a back surface of a semiconductor substrate 110.

More specifically, an emitter region 120 containing first impurities is formed at the back surface of the semiconductor substrate 110.

Next, a back surface field region 170 containing second impurities of a conductive type opposite the first impurities is formed at the back surface of the semiconductor substrate 110 and is separated from the emitter region 120.

Next, a passivation layer 130 is formed on a front surface of the semiconductor substrate 110 opposite the back surface of the semiconductor substrate 110.

Next, a first electrode paste 140*a* is applied to the emitter region 120, and a second electrode paste 150*a* is applied to the back surface field region 170 using various application methods including an inkjet printing method, a screen printing method, a spin coating method, etc. Then, the first electrode 140 is formed on the emitter region 120, and the second electrode 150 is formed on the back surface field region 170 using the light sintering device 20. Namely, the light sintering device 20 may irradiate the pulse type white light onto the back surface of the semiconductor substrate 110 to sinter the first electrode paste 140*a* and the second electrode paste 150*a*. Hence, the first electrode 140 connected to the emitter region 120 and the second electrode 150 connected to the back surface field region 170 may be formed.

The first electrode paste 140*a* may include fine metal particles 1 of about 50 to 80 wt %, a binder 2 of about 15 to 40 wt %, and a solvent 3 of about 5 to 40 wt %. It may be preferable, but not required, that an amount of the fine metal particles 1 is greater than a sum of an amount of the binder 2 and an amount of the solvent 3, and the amount of the binder 2 is greater than the amount of the solvent 3.

The second electrode paste 150*a* may include fine metal particles 1 of about 50 to 80 wt %, a binder 2 of about 15 to 40 wt %, and a solvent 3 of about 5 to 40 wt %. It may be preferable, but not required, that an amount of the fine metal particles 1 is greater than a sum of an amount of the binder 2 and an amount of the solvent 3, and the amount of the binder 2 is greater than the amount of the solvent 3.

Furthermore, as shown in FIG. 10, the electrode forming method according to the embodiment of the invention may be applied to a solar cell, in which a first electrode 140 having a two-layered structure including a first electrode layer 140L and a first transparent electrode layer 140C and a second electrode 150 having a two-layered structure including a second electrode layer 150L and a second transparent electrode layer 150C are positioned on a back surface of a semiconductor substrate 110.

A solar cell shown in FIG. 10 may include a semiconductor substrate 110, a tunnel layer 180 on a back surface of the semiconductor substrate 110, a first conductive region (an emitter region) 120, a second conductive region (a back surface field region) 170, an insulating layer 190, a first electrode 140, and a second electrode 150. In the embodiment disclosed herein, the tunnel layer 180 may be omitted, if desired or necessary. The embodiment of the invention is described using the solar cell including the tunnel layer 180 as an example.

A front surface of the semiconductor substrate 110 may be an uneven surface having a plurality of uneven portions or having uneven characteristics. Hence, an amount of light reflected from the front surface of the semiconductor substrate 110 may decrease, and an amount of light incident on the inside of the semiconductor substrate 110 may increase.

The tunnel layer 180 may be formed between the entire back surface of the semiconductor substrate 110 and front surfaces of the first and second conductive regions 120 and 170. Thus, a front surface of the tunnel layer 180 may directly contact the entire back surface of the semiconductor substrate 110, and a back surface of the tunnel layer 180 may directly contact the front surfaces of the first and second conductive regions 120 and 170. The tunnel layer 180 may be formed by depositing a dielectric material or a semiconductor material on the back surface of the semiconductor substrate 110. Namely, the tunnel layer 180 may include a dielectric material or a semiconductor material.

More specifically, the tunnel layer 180 may be formed of the dielectric material such as silicon oxide (SiOx) or the semiconductor material such as amorphous silicon (a-Si) and silicon carbide (SiC). Other materials may be used. For example, the tunnel layer 180 may be formed of silicon nitride (SiNx), hydrogenated SiNx, aluminum oxide (AlOx), silicon oxynitride (SiON), or hydrogenated SiON.

Carriers produced in the semiconductor substrate 110 may pass through the tunnel layer 180, and the tunnel layer 180 may perform a passivation function with respect to the back surface of the semiconductor substrate 110.

A thickness of the tunnel layer 180 may be 1 nm to 3 nm, so as to properly perform the passivation function with respect to the semiconductor substrate 110 while causing carriers produced in the semiconductor substrate 110 to pass through the tunnel layer 180. Even when a high temperature thermal process is used to manufacture the solar cell, the tunnel layer 180 may prevent or reduce characteristics (for example, carrier life time) of the semiconductor substrate 110 from being damaged.

The first and second conductive regions 120 and 170 may be formed of a single crystal silicon material, a polycrystalline silicon material, an amorphous silicon material, or a metal oxide material. In this instance, the first conductive region 120 and the second conductive region 170 may be respectively doped with impurities of a first conductive type and impurities of a second conductive type and may have opposite conductive types. Alternatively, when the first and second conductive regions 120 and 170 are formed of the metal oxide material, the first and second conductive regions 120 and 170 may have opposite conductive types by Fermi level of the metal oxide material. At least one of the first and second conductive regions 120 and 170 may have a conductive type opposite the semiconductor substrate 110 and function as an emitter region, and the other may have the same conductive type as the semiconductor substrate 110 and function as a back surface field region.

The insulating layer 190 may be positioned between the first and second electrodes 140 and 150 and on a portion, which is not connected to the first and second electrodes 140 and 150 in back surfaces of the first and second conductive regions 120 and 170.

The insulating layer 190 between the first and second electrodes 140 and 150 can prevent a short circuit between the first and second electrodes 140 and 150. Further, the insulating layer 190 on the back surfaces of the first and second conductive regions 120 and 170 can perform a passivation function to remove a defect resulting from a dangling bond at the back surfaces of the first and second conductive regions 120 and 170 and to prevent carriers produced in the semiconductor substrate 110 from being recombined and disappeared by the dangling bond.

The insulating layer 190 may be formed of a dielectric material. For example, the insulating layer 190 may be formed of at least one of amorphous silicon oxide (a-SiOx), amorphous silicon nitride (a-SiNx), amorphous silicon carbide (a-SiCx), or aluminum oxide (AlOx). In addition, the insulating layer 190 may be formed of at least one of hydrogenated silicon nitride (SiNx:H), hydrogenated silicon oxide (SiOx:H), hydrogenated silicon nitride oxide (SiNxOy:H), hydrogenated silicon oxynitride (SiOxNy:H), or hydrogenated amorphous silicon (a-Si:H).

In the embodiment of the invention, the first and second electrodes 140 and 150 may respectively include first and second electrode layers 140L and 150L which have a surface shape (or a planar shape) of a two-layered structure.

More specifically, the first electrode 140 may include the first electrode layer 140L which is entirely formed on the back surface of the semiconductor substrate 110 in the surface shape and has an opening in a formation area of the second conductive region 170. Further, the second electrode 150 may include the second electrode layer 150L which is connected to the second conductive region 170 through the opening of the first electrode layer 140L, is separated from the first electrode layer 140L while overlapping the first electrode layer 140L at the back surface of the semiconductor substrate 110, and is entirely formed on the back surface of the semiconductor substrate 110 in the surface shape.

As described above, when the first and second electrodes 140 and 150 are configured as the two-layered structure of the first and second electrode layers 140L and 150L, a resistance loss of the first and second electrodes 140 and 150 can be minimized by minimizing a horizontal movement distance of carriers. Further, a tabbing process for connecting a plurality of solar cells in series using an interconnector to modularize the plurality of solar cells may be further simplified.

The first electrode 140 may further include a first transparent electrode layer 140C positioned between the first electrode layer 140L and the first conductive region 120. The first transparent electrode layer 140C may be entirely formed on the back surface of the semiconductor substrate 110 in the surface shape and may have a plurality of openings in a formation area of the second conductive region 170. The first transparent electrode layer 140C may be directly connected to the first conductive region 120.

Further, the second electrode 150 may further include a second transparent electrode layer 150C that is positioned in a formation area of the openings of the first transparent electrode layer 140C and is positioned between the second electrode layer 150L and the second conductive region 170. The second transparent electrode layer 150C may function to connect the second electrode layer 150L to the second conductive region 170 through the first electrode layer 140L or the openings of the first transparent electrode layer 140C.

The first and second transparent electrode layers 140C and 150C may be formed of transparent conductive oxide. For example, the first and second transparent electrode layers 140C and 150C may be formed of at least one of indium tin oxide (ITO), indium zinc oxide (IZO), zinc oxide (ZnO), indium tungsten oxide (IWO), or hydrogen-doped indium oxide (IO:H).

The first and second transparent electrode layers 140C and 150C can reduce contact resistances between the first and second transparent electrode layers 140C and 150C and the first and second conductive regions 120 and 170. Further, the first and second transparent electrode layers 140C and 150C can prevent a plasma damage, an increase in recombination of carriers, and diffusion of ions of a metal material included in the first and second electrode layers 140L and 150L, which may be generated when the metal material included in the first and second electrode layers 140L and 150L is formed on the first and second conductive regions 120 and 170, since the metal material, for example, copper (Cu) or aluminum (Al) included in the first and second electrode layers 140L and 150L is not directly connected to the first and second conductive regions 120 and 170 through the first and second transparent electrode layers 140C and 150C.

After the first electrode paste 140a or the second electrode paste 150a is applied, the first electrode paste 140a or the second electrode paste 150a may be sintered using the light sintering device to form at least one of the first and second electrode layers 140L and 150L. As an example of forming the first and second electrode layers 140L and 150L, the first electrode layer 140L may be formed by applying the first electrode paste 140a and then sintering the first electrode paste 140a using the light sintering device, and the second electrode layer 150L may be formed through a sputtering method, a printing method (for example, a screen printing method), a deposition method, a plating method, and the like. As another example of forming the first and second electrode layers 140L and 150L, the first electrode layer 140L may be formed through the sputtering method, the printing method (for example, the screen printing method), the deposition method, the plating method, and the like, and the second electrode layer 150L may be formed by applying the second electrode paste 150a and then sintering the second electrode paste 150a using the light sintering device. As another example of forming the first and second electrode layers 140L and 150L, the first electrode layer 140L may be formed by applying the first electrode paste 140a and then sintering the first electrode paste 140a using the light sintering device, and the second electrode layer 150L may be formed by applying the second electrode paste 150a and then sintering the second electrode paste 150a using the light sintering device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell, the method comprising:
    applying an electrode paste on a semiconductor substrate, wherein the electrode paste includes fine metal particles, a binder, and a solvent; and
    sintering the electrode paste using a light sintering device to form an electrode,
    wherein the sintering of the electrode paste to form the electrode includes:
        evaporating the solvent included in the electrode paste; and
        irradiating light, after the evaporation of the solvent, to evaporate the binder included in the electrode paste and sinter the fine metal particles to form the electrode,
    wherein the evaporating of the solvent and the irradiating of the light are performed at different temperatures,
    wherein a temperature to evaporate the binder is higher than a temperature of the evaporating of the solvent,
    wherein the solvent is evaporated at the temperature of about 80° C. to 150° C., and
    wherein the binder is evaporated at the temperature of about 100° C. to 500° C.

2. The method of claim 1, wherein an amount of the fine metal particles is greater than a sum of an amount of the hinder and an amount of the solvent, and the amount of the binder is greater than the amount of the solvent.

3. The method of claim 2, wherein the amount of the fine metal particles is about 50 to 80 wt %.

4. The method of claim 2, wherein the amount of the binder is about 15 to 40 wt %.

5. The method of claim 2, wherein the amount of the solvent is about 5 to 40 wt %.

6. The method of claim 1, wherein the fine metal particles include at least one conductive material of silver (Ag), copper (Cu), Cu—Ni or Cu—Ag.

7. The method of claim 6, wherein the fine metal particles are a micro-sized powder or a nano-sized powder.

8. The method of claim 1, wherein the electrode paste is applied using an inkjet printing method, a screen printing method, or a spin coating method.

9. The method of claim 1, wherein the light sintering device includes a light output unit outputting the light to the electrode paste and sintering the electrode paste through the irradiation of the light.

10. The method of claim 9, wherein the light output unit includes:
    a reflective plate disposed on an upper part of a xenon flash lamp and changing a light path so that the light output from the xenon flash lamp in an opposite direction of the semiconductor substrate is output in a direction of the semiconductor substrate;
    a light wavelength filter disposed on a lower part of the xenon flash lamp and filtering only the light having a predetermined wavelength band;
    a light induction unit disposed on a lower part of the light wavelength filter and adjusting a position of the light so that the light is irradiated onto the electrode paste; and
    a cooling unit supplying a coolant to the xenon flash lamp through a cooling path to cool the xenon flash lamp.

11. The method of claim 9, wherein the light sintering device further includes a transfer unit disposed on a lower part of the light output unit and transferring the semiconductor substrate in one direction.

12. The method of claim 1, wherein the temperature for evaporating of the solvent and the temperature to evaporate the binder overlap.

* * * * *